(12) United States Patent
Maaref et al.

(10) Patent No.: US 9,479,292 B2
(45) Date of Patent: *Oct. 25, 2016

(54) SYSTEM AND METHOD FOR TERMINAL-GROUP BASED HARQ FOR CELLULAR INTEGRATED D2D COMMUNICATIONS

(71) Applicant: Huawei Technologies Co., Ltd., Shenzhen (CN)

(72) Inventors: Amine Maaref, Kanata (CA); Mohammadhadi Baligh, Ottawa (CA); Jianglei Ma, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/881,651

(22) Filed: Oct. 13, 2015

(65) Prior Publication Data

US 2016/0036565 A1 Feb. 4, 2016

Related U.S. Application Data

(63) Continuation of application No. 13/829,188, filed on Mar. 14, 2013, now Pat. No. 9,172,512.

(60) Provisional application No. 61/738,907, filed on Dec. 18, 2012.

(51) Int. Cl.
*H04L 1/18* (2006.01)
*H04L 1/08* (2006.01)
(Continued)

(52) U.S. Cl.
CPC .............. *H04L 1/08* (2013.01); *H04L 1/188* (2013.01); *H04L 1/1816* (2013.01);
(Continued)

(58) Field of Classification Search
CPC .............. H04L 1/1816; H04L 1/188; H04L 2001/0093; H04L 2001/0097

USPC ........ 714/748–751, 776, 746, 749, 755, 786
See application file for complete search history.

(56) References Cited

U.S. PATENT DOCUMENTS 9,172,512 B2 * 10/2015 Maaref et al.
2007/0245204 A1 10/2007 Yomo et al.
(Continued)

FOREIGN PATENT DOCUMENTS

JP 2008227642 A 9/2008
JP 2011514109 A 4/2011
(Continued)

OTHER PUBLICATIONS

IEEE, "Annex 2, Standard for local and metropolitan area networks—Part 16: Air interface for broadband wireless access systems—Amendment1: Multihop relay specification," ARIB STD-105, IEEE Std 802.13j -2009 (Amendment to IEEE Std 802.16-2009), Jun. 12, 2009, 315 pages.
(Continued)

*Primary Examiner* — Guy Lamarre
(74) *Attorney, Agent, or Firm* — Slater Matsil, LLP

(57) ABSTRACT

System and method embodiments are provided to support network communications with groups of UEs. The embodiments include a two-level group-based hybrid-automatic repeat request (HARQ) mechanism and acknowledgement (ACK)/negative ACK (NACK) feedback. An embodiment method includes receiving, at a UE within a virtual multipoint (ViMP) comprising UEs, a data packet for a target UE (TUE) that is broadcasted from a base station (BS) to the ViMP node, decode the data packet, and upon successfully decoding the data packet, broadcasting the data packet to the UEs within the ViMP node until a timer pre-established by the BS expires or an ACK message is received from the TUE or the ViMP node. In an embodiment, broadcasted data received in the ViMP node is re-broadcasted upon receiving a negative acknowledgment (NACK) message from the TUE, a beacon UE, or any of the UEs within the ViMP node.

20 Claims, 6 Drawing Sheets

(51) Int. Cl.
*H04L 12/18* (2006.01)
*H04L 1/00* (2006.01)

(52) U.S. Cl.
CPC .......... *H04L 1/1829* (2013.01); *H04L 12/189* (2013.01); *H04L 1/0076* (2013.01); *H04L 2001/0093* (2013.01); *H04L 2001/0097* (2013.01)

(56) References Cited

U.S. PATENT DOCUMENTS

| | | |
|---|---|---|
| 2008/0222478 A1 | 9/2008 | Tamaki |
| 2009/0232044 A1 | 9/2009 | Chang et al. |
| 2010/0325502 A1 | 12/2010 | Lindskog et al. |
| 2011/0053657 A1 | 3/2011 | Ji |
| 2011/0128941 A1 | 6/2011 | Ishii |
| 2012/0003940 A1 | 1/2012 | Hirano et al. |
| 2012/0093098 A1 | 4/2012 | Charbit et al. |
| 2012/0182860 A1 | 7/2012 | Liu et al. |
| 2013/0039164 A1 | 2/2013 | Horiuchi et al. |
| 2013/0111288 A1 | 5/2013 | Sagfors et al. |

FOREIGN PATENT DOCUMENTS

| | | |
|---|---|---|
| WO | 2009131867 A2 | 10/2009 |
| WO | 2010082084 A1 | 7/2010 |
| WO | 2010110191 A1 | 9/2010 |
| WO | 2011156958 A1 | 12/2011 |

OTHER PUBLICATIONS

IEEE, "Annex-4 IEEE Std 802.16m-2011 Standard for locas and metropolitan area networks—Part 16: Air interface for broadband wireless access systems—Amendment 3: Advanced air interfact," ARIB STD-T105, IEEE Std 802.16-2011 (Amendment to IEEE Std 802.16-2009), May 6, 2011, 1107 pages.

International Search Report received in Application No. PCT/CN2013/089687, mailed Mar. 20, 2014, 11 pages.

Lang, Y., et al., "Improved HARQ based on Network Coding and its Application in LTE," IEEE, 2012, 6 pages.

Vanganuru, K., et al., "Uplink System Capacity of a Cellular Network with Cooperative Mobile Relay," IEEE, 2011, 7 pages.

Extended European Search Report Application No. 13864179.0-1851 mailed Dec. 7, 2015, 8 pages.

Sundaresan, et al., "ATP: A Reliable Transport Protocol for Ad Hoc Networks," IEEE Transactions on Mobile Computing, vol. 4, No. 6, Nov./Dec. 2005, 16 pages.

\* cited by examiner

SYSTEM AND METHOD FOR TERMINAL-GROUP BASED HARQ FOR CELLULAR INTEGRATED D2D COMMUNICATIONS

This application is a continuation of U.S. patent application Ser. No. 13/829,188 filed on Mar. 14, 2013, now U.S. Pat. No. 9,172,512 issued Oct. 27, 2015, by Amine Maaref et al. and entitled "System and Method for Terminal-Group Based HARQ for Cellular Integrated D2D Communications," which claims the benefit of U.S. Provisional Application No. 61/738,907 filed on Dec. 18, 2012 by Amine Maaref et al. and entitled "System and Method for Network Coding Assisted Terminal-Group Based HARQ," all of which applications are hereby incorporated herein by reference as if reproduced in their entirety.

TECHNICAL FIELD

The present invention relates to the field of wireless communications, and, in particular embodiments, to a system and method for terminal-group based HARQ for cellular integrated device-to-device (D2D) communications.

BACKGROUND

Direct mobile communications (DMC) and cellular controlled device to device (D2D) communications are expected to play a significant role in next generation wireless networks. User equipment (UE) cooperation based on D2D communications is one technology that is receiving attention. With advances in D2D communications, UE cooperation is expected to play a role in the future of wireless communications. This technology can be used to provide diversity in space, time and frequency, and increase the robustness against fading and interference. In UE cooperation, the D2D communications are used to establish joint UE reception, where some of the UEs act as relays for other UEs to improve system throughput and coverage. However, joint UE reception using D2D communications can also increase the complexity of the network communications, such as for hybrid-automatic repeat request (HARQ) signaling. The HARQ mechanism is a link adaptation technique that can improve communications (for erroneous data packets) in current wireless cellular networks. However, current implementations of HARQ do not take UE grouping into account and do not efficiently exploit D2D UE cooperation capabilities. Therefore, there is a need for efficient schemes that leverage UE cooperation and D2D communications with the HARQ mechanism.

SUMMARY

In accordance with an embodiment, a method for supporting two-level terminal-group based hybrid-automatic repeat request (HARQ) signaling includes receiving, at a (UE) within a virtual multi-point (ViMP) node of UEs, a data packet for a target UE (TUE) that is broadcasted from a base station (BS) to the ViMP node, attempting to decode the data packet, and upon successfully decoding the data packet, broadcasting the data packet within the ViMP node until a timer pre-established by the BS has expired or an acknowledgement (ACK) message is received from the TUE or the ViMP node.

In another embodiment, a method for supporting two-level terminal-group based HARQ signaling includes receiving, at a UE within a ViMP node of UEs, a data packet that is broadcasted from a BS to the ViMP node and intended for the UE, attempting to decode the data packet, and upon successfully decoding the data packet, broadcasting an ACK message within the ViMP node and to the BS.

In another embodiment, a method for supporting two-level terminal-group based HARQ signaling includes broadcasting, at a BS, a data packet for a target UE (TUE) to a ViMP node comprising UEs including the TUE, initiating a timer with a pre-determined time limit upon broadcasting the data packet, and re-broadcasting the data packet to the ViMP node upon the timer reaching the time limit absent of receiving an ACK message from the TUE.

In yet another embodiment, a UE supporting two-level terminal-group based HARQ signaling includes a processor and a computer readable storage medium storing programming for execution by the processor. The programming includes instructions to receive, within a ViMP node comprising multiple UEs, a data packet for a TUE that is broadcasted from a BS to the ViMP node, attempt to decode the data packet, and upon successfully decoding the data packet, broadcast the data packet within the ViMP node until a timer pre-established by the BS has expired or an ACK message is received from the TUE.

In another embodiment, a UE supporting two-level terminal-group based HARQ signaling includes a processor and a computer readable storage medium storing programming for execution by the processor. The programming includes instructions to receive, within a ViMP node comprising multiple UEs, a data packet that is broadcasted from a BS to the ViMP node and intended for the UE, attempt to decode the data packet, and upon successfully decoding the data packet, broadcasting an ACK message within the ViMP node and to the BS.

In another embodiment, a network component supporting two-level terminal-group based HARQ signaling includes a processor and a computer readable storage medium storing programming for execution by the processor. The programming includes instructions to broadcast a data packet for a TUE to a ViMP node comprising UEs including the TUE, initiating a timer with a pre-determined time limit upon broadcasting the data packet, and re-broadcasting the data packet to the ViMP node upon the timer reaching the time limit until receiving an ACK message from the TUE.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
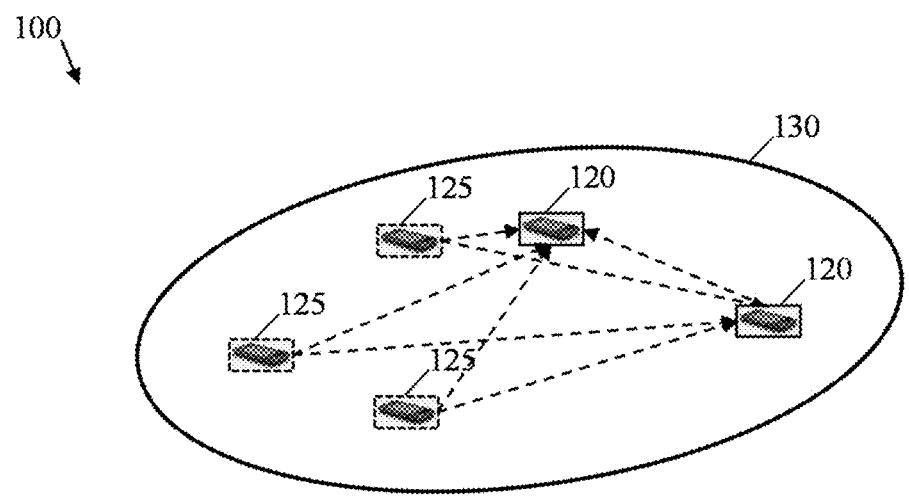
FIG. 1 illustrates D2D communications with UE cooperation.

FIG. 1 illustrates a system 100 for D2D communications with UE cooperation. A plurality of UEs cooperate to form a logical/virtual multi-point (ViMP) node 130 acting as single distributed virtual transceiver. The term ViMP node can also be referred to herein as a UE group, cooperating UEs, or a joint reception/transmission group. A ViMP node 130 includes a set of target UEs (TUEs) 120 and cooperating UEs (CUEs) 125. The CUEs 125 help the TUEs 120 communicate with a wireless network (not shown), e.g., to receive data on the downlink and/or transmit data on the uplink. As such, the UEs of the ViMP node 130 can jointly transmit data on the uplink channel and jointly receive data on the downlink channel.

Downlink ViMP reception involves two stages. In the downlink broadcast phase, the network broadcasts a data packet to the ViMP receiver (Rx) node 130 using ViMP-radio network temporary identifier (RNTI). Depending on the ViMP cooperation scenario (e.g., capacity enhancement, coverage extension, or other scenarios), both TUEs 120 and CUEs 125 listen and try to decode the data packet during this phase. In the D2D data forwarding phase, the CUEs 125 forward some information to the TUEs 120 to help them decode the information broadcast by the network during the first phase. Information sent by the CUEs 125 during this phase depends on the ViMP cooperation strategy (e.g., decode-and-forward (DF), amplify-and-forward (AF), joint reception (JR), or other strategies).

Figure 2:
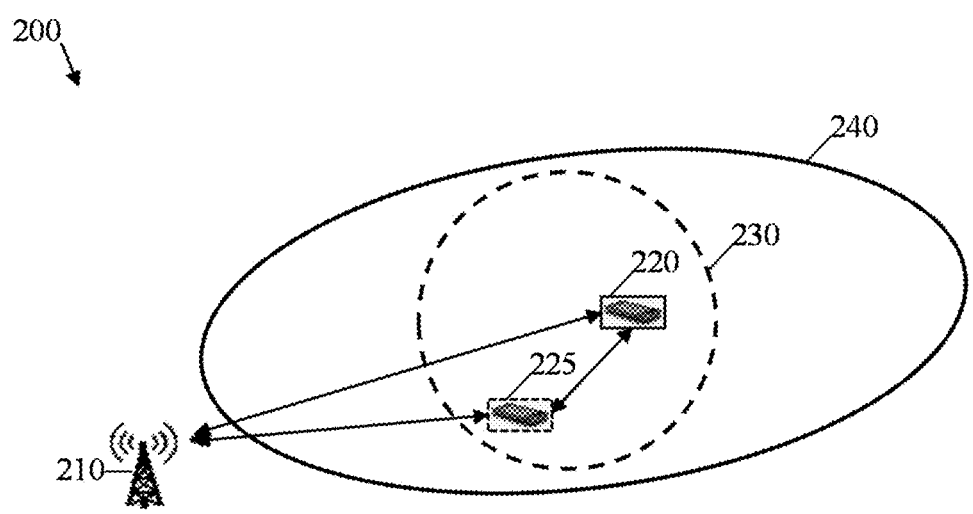
FIG. 2 illustrates a BS communicating with cooperating UEs.

FIG. 2 illustrates a system 200 for a base station (BS) communicating with cooperating UEs. A BS 210 communicates in a downlink with a ViMP Rx node 230 that includes a TUE 220 and one or more CUEs 225 (only one is shown), within a coverage range or cell range 240 of the BS 210. Depending on the DF relaying protocol, the whole codeword is decoded by the CUE 225 before forwarding the whole or part of the message. If the CUE 225 cannot successfully decode a packet, the CUE 225 can still help by cooperatively sending subsets of their log-likelihood ratios (LLRs).

Currently, the HARQ mechanism does not take UE grouping, such as in systems 100 and 200, into account and hence cannot efficiently take advantage of the D2D UE cooperation capabilities. System and method embodiments are provided to support network (or BS) communications with groups of UEs (e.g., in ViMP nodes). The embodiments include enhanced group-based retransmission mechanisms, e.g., a group-based HARQ scheme, and advanced ACK/NACK protocols, as described below.

In an embodiment for terminal-group based HARQ for cellular integrated D2D communications, a two-level HARQ mechanism is implemented to exploit the group nature of the virtual multi-point (ViMP) transceiver (also referred to herein as a terminal-group transceiver) to enable efficient retransmission of erroneous data packets in a D2D-enabled wireless cellular network. Examples of cellular networks with D2D capability include but are not limited to 3GPP LTE, LTE-A, IEEE WiMAX, and similar systems. The two-level terminal group-based HARQ mechanism also exploits the broadcast nature of the wireless channel. The second level of the mechanism includes a distributed HARQ scheme that provides low signaling overhead. The mechanism assisted by network coding, which reduces the number of required retransmissions, provides more efficient HARQ, and improves throughput.

Figure 3:
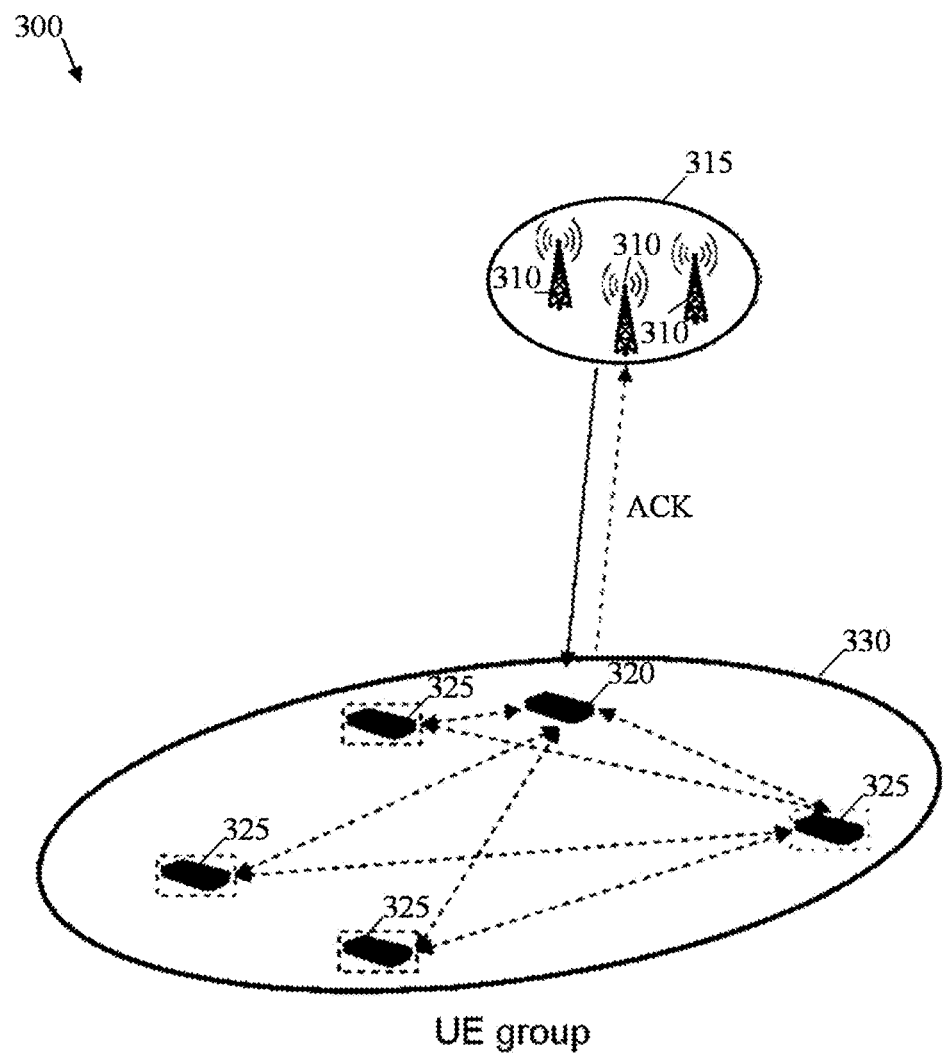
FIG. 3 illustrates an embodiment of a cooperative HARQ mechanism.

FIG. 3 illustrates an embodiment of a terminal-group based or cooperative HARQ mechanism 300. A group 315 of one or more BS 310 in the network sends N packets $p_1, p_2, \ldots, p_N$ (N is an integer) to a plurality of TUEs 325 in a ViMP node 330. The packets can be sent sequentially over time during N broadcast phases, e.g., if there is a single TUE 320 in the ViMP node 330. Less than N broadcast phases may be used if there are multiple TUEs 320 in the ViMP node 330 or in case of UEs supporting multi-rank transmissions. Each packet is controlled by a separate HARQ process. During each broadcast phase, the TUE 320 and all the involved CUEs 325 try to decode. During the data forwarding phase, the CUEs 325 forward to the TUEs 320 a network coded version of: (i) the same original packets they have successfully decoded (e.g. $p=p_1 \oplus p_2 \oplus \ldots \oplus p_N$), (ii) additional coded symbols in case of a concatenated low-density parity-check (LDPC) coding scheme for half-duplex decode-and-forward (DF) relays, and/or (iii) a given redundancy version, e.g., using Turbo-Coding. Based on the soft information that the TUE(s) 320 receive for $p_1, p_2, \ldots, p_N$ from a BS 310 or the group 315 and the additional information forwarded by the CUEs 325, the TUE(s) 320 try to decode their own packets. If a TUE 320 is able to decode a packet, it broadcasts an acknowledgement (ACK) message within the ViMP node 330 and back to the BS 310 or the group 315.

The network coded packet transmitted by each CUE 325 is not necessarily based on an XOR operation, which corresponds to operation in a Gallois Field of order 2, GF(2). An operation in any GF($2^n$) where n>1 is also possible, in which case the network coded packet may consist of any linear combination of the successfully decoded packets according to:

$$p = \alpha_1 p_1 + \alpha_2 p_2 + \ldots + \alpha_N p_N,$$

where $\alpha_1, \alpha_2, \ldots, \alpha_N$ are coefficients that are sent to the TUE 320 along with the information on which packets were network coded. In another embodiment, the coefficients $\alpha_1, \alpha_2, \ldots, \alpha_N$ can be known beforehand and do not need to be forwarded by the CUEs 325.

Figure 4:
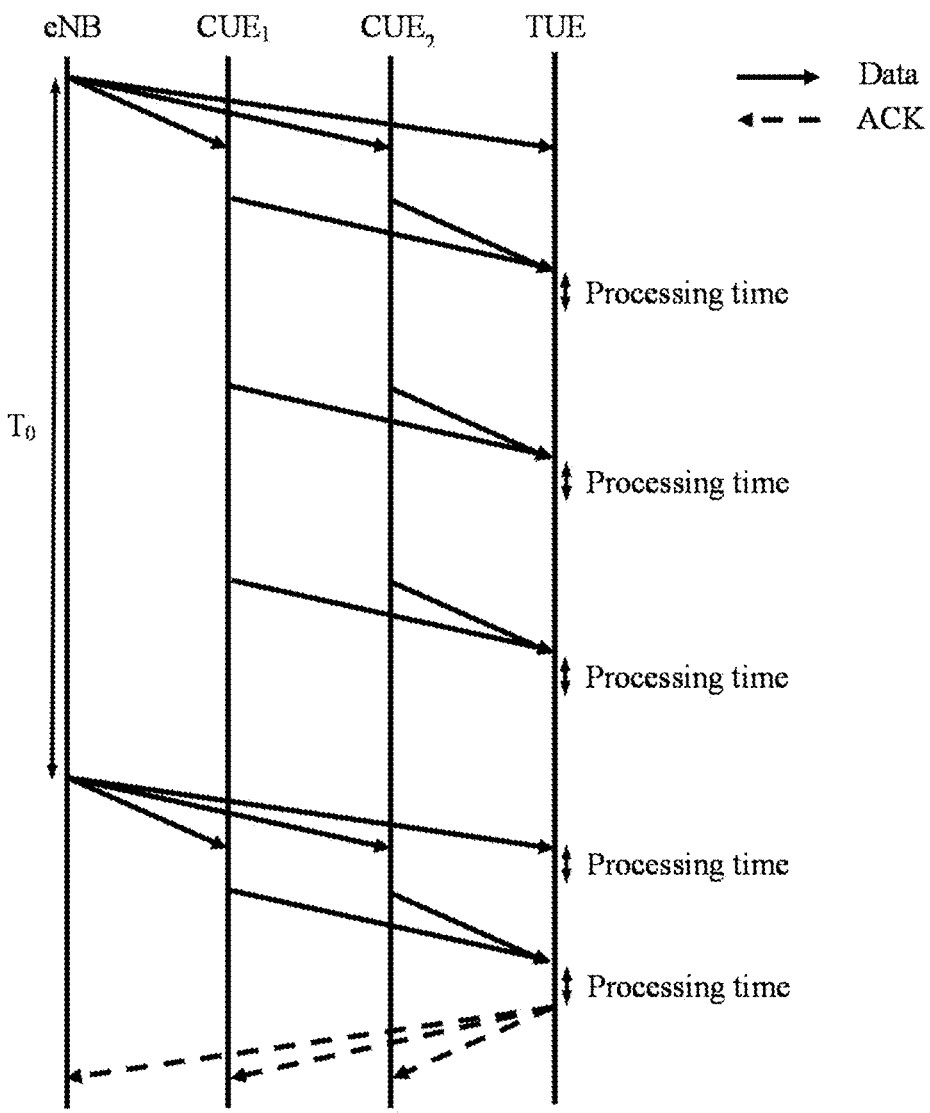
FIG. 4 illustrates an embodiment of a two-level HARQ scheme with a timer and without NACK feedback.

FIG. 4 illustrates en embodiment of a two-level HARQ scheme 400 without NACK feedback, which can be used in the HARQ mechanism 300. At a first level of the HARQ scheme 400 between an eNB (or a BS) and a ViMP node (or UE group), the eNB sends a packet to the UE group, and a timer is started at the eNB. While the timer <$T_0$ ($T_0$ is a pre-determined time limit), the TUE and CUEs within the ViMP node try to decode the packet, and the CUEs which successfully decode the packet broadcast the packet within ViMP node. At a second level of the HARQ scheme 400 within the ViMP node, the CUEs that can decode the packet, either from the first eNB transmission or from a broadcast by other CUEs, broadcast the packet (or another version) within the ViMP node. The second level HARQ process within the ViMP Rx node continues until the packet is successfully decoded by the TUE. In this case, an ACK is broadcast within the ViMP node and sent back to the eNB. Otherwise, the second level HARQ process within the ViMP Rx node continues until the timer at the eNB reaches the limit $T_0$. In this case, the eNB assumes a Negative ACK (NACK) response and resends the packet (or another version). In the scheme 400, the TUE does not actually transmit a NACK response if the packet is not successfully decoded. The second level distributed HARQ uses the participation of UEs within the ViMP node without synchronization with the eNB (or the network) and without using scheduling within the ViMP node.

Figure 5:
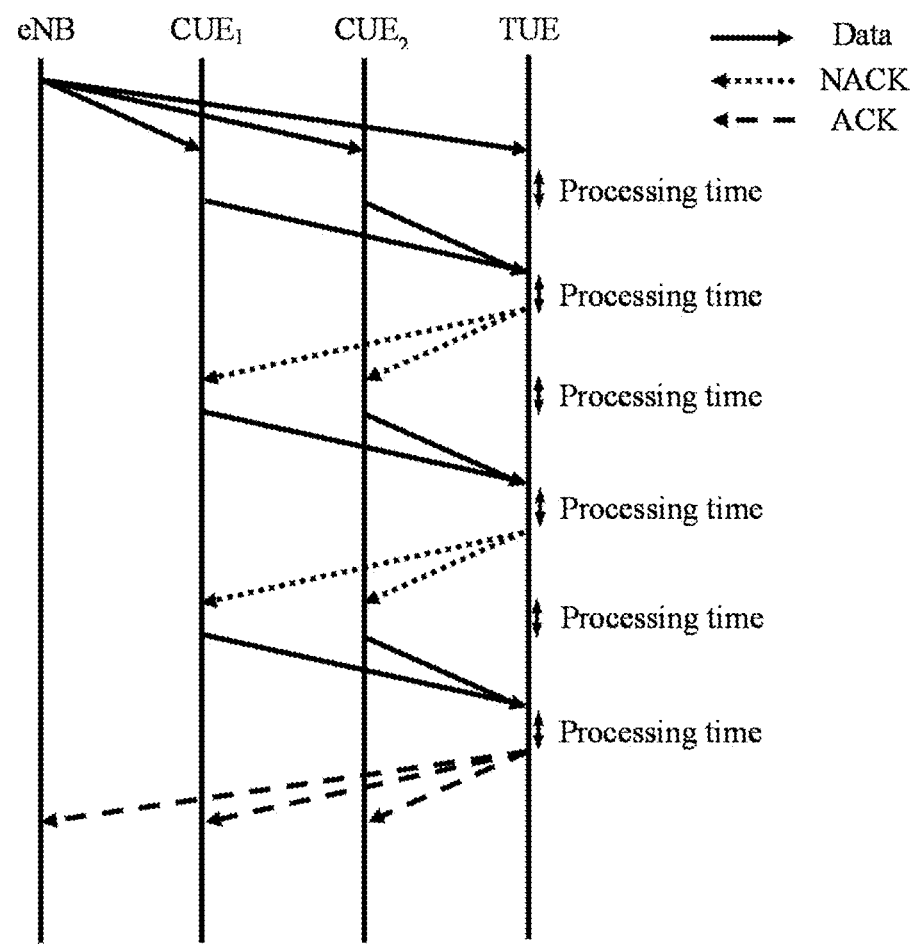
FIG. 5 illustrates an embodiment of a two-level HARQ scheme with a timer and second-level NACK feedback.

FIG. 5 illustrates an embodiment of a two-level HARQ scheme 500 with NACK feedback within a ViMP node, which can be used in the HARQ mechanism 300. At a first level of the HARQ scheme 500, a eNB (or BS) sends a packet to a ViMP node (or UE group), and a timer is started at the eNB. While the timer <$T_0$, the TUE and CUEs within the ViMP node try to decode the packet, and the CUEs that successfully decode the packet send a broadcast packet within ViMP node. At the second level HARQ within the ViMP node, if the packet is not successfully decoded by the TUE, then the TUE broadcasts a NACK message within the ViMP Rx node. Thus, the CUEs that can decode the packet, either from the first eNB transmission or from a broadcast by other CUEs, broadcast the packet or another version within the ViMP node. The second level HARQ process within the ViMP Rx node continues until the packet is successfully decoded by the TUE. In this case, an ACK is broadcast within the ViMP node and sent to the eNB. Otherwise, the second level HARQ process within the ViMP Rx node continues until the timer at the eNB reaches a limit. In this case, the eNB assumes a NACK and resends the packet or another version. In the scheme 500, the CUEs rebroadcast the packet at the second level HARQ within the ViMP node if or upon receiving the NACK from the TUE. The second level distributed HARQ uses the participation of UEs within the ViMP node without synchronization with the eNB (or the network) and without using scheduling within the ViMP node.

Figure 6:
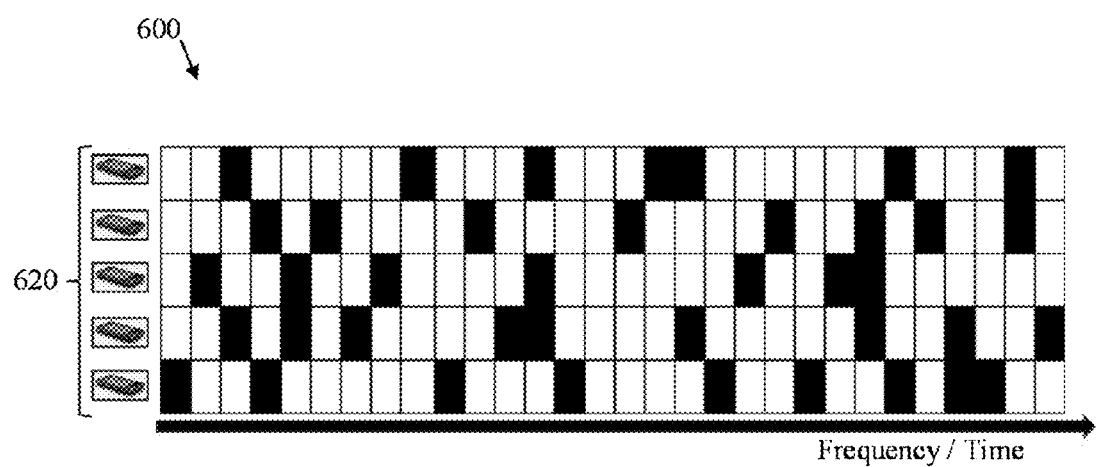
FIG. 6 illustrates a UE time/frequency resource grid.

FIG. 6 illustrates a time/frequency resource grid 600 from all UEs 620 (including TUEs and CUEs) in a ViMP node. For decoding at a TUE, transmissions from different CUEs are separated in the time/frequency/code domain (or any combinations thereof) to distinguish between them at the TUE. In one embodiment, different HARQ redundancy versions/LDPC codewords are mapped to orthogonal signatures and sent from different CUEs. The TUE accumulates the soft information received from all CUEs along with the information that the TUE received from the BS to try to decode the packets.

The target UE can be declared in different levels explicitly or implicitly in the control channel, where the target UE is known to the group, or explicitly or implicitly in the data packet, where the target UE is only known after the data is correctly decoded. With a clear target UE at control channel, the target UE may send a NACK if it does not receive the packet. Without a clear target UE at control channel, the system may lack an explicit NACK signaling. The NACK may be implicitly implied when no ACK is received.

The ACK/NACK signaling to the network can be sent by the TUE or the CUE. It can be done proactively (by any UE in the group receiving it) or reactively by the TUE only. Proactively, each UE in the group, which receives the data, sends back an ACK and takes responsibility for data forwarding. A NACK may be in this case implied by not sending an ACK message. If more than one UE receives the data, the ACK signal from the UEs may be combined over the air. A beacon UE is a UE in the group (probably with the best channel and not necessarily the TUE) that takes care of the ACK channel. Reactively, the TUE sends ACK/NACK after it receives help from other UEs considering the process and forwarding time.

Figure 7:
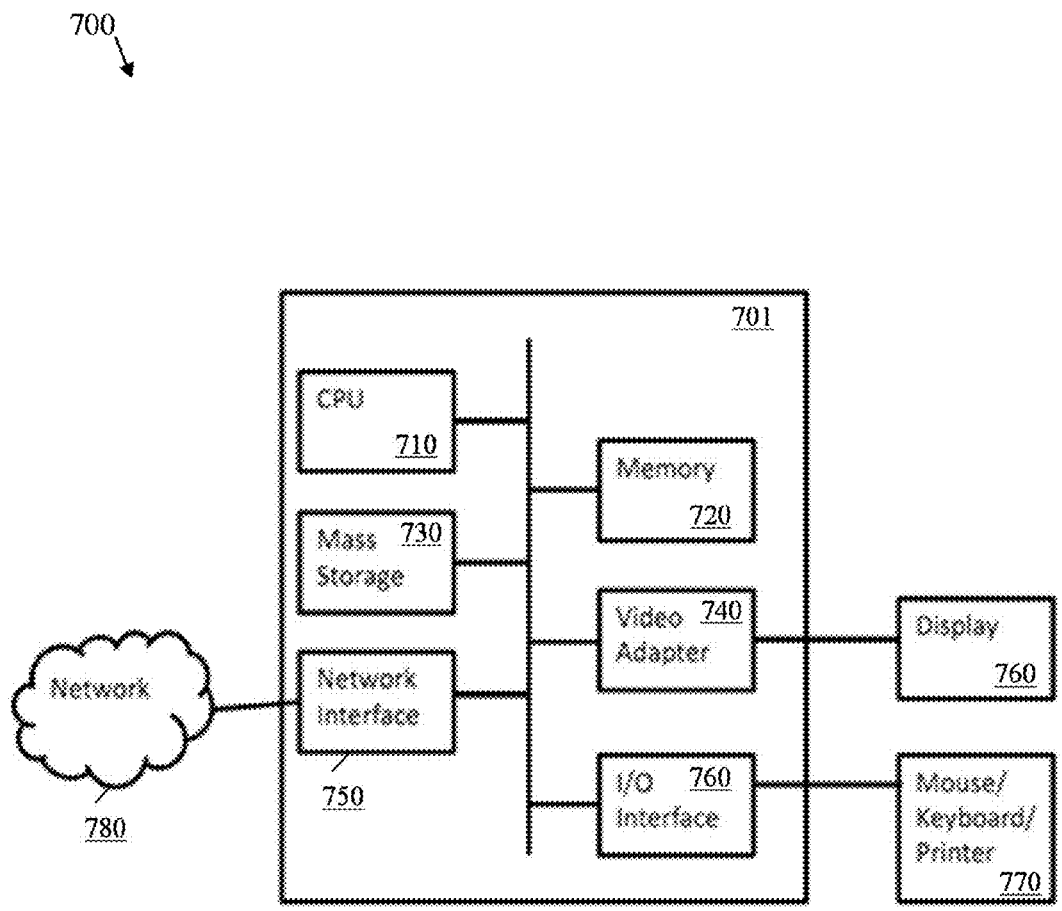
FIG. 7 illustrates a processing system that can be used to implement various embodiments.

FIG. 7 is a block diagram of a processing system 700 that can be used to implement various embodiments. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system 700 may comprise a processing unit 701 equipped with one or more input/output devices, such as a speaker, microphone, mouse, touchscreen, keypad, keyboard, printer, display, and the like. The processing unit 701 may include a central processing unit (CPU) 710, a memory 720, a mass storage device 730, a video adapter 740, and an I/O interface 750 connected to a bus. The bus may be one or more of any type of several bus architectures including a memory bus or memory controller, a peripheral bus, a video bus, or the like.

The CPU 710 may comprise any type of electronic data processor. The memory 720 may comprise any type of system memory such as static random access memory (SRAM), dynamic random access memory (DRAM), synchronous DRAM (SDRAM), read-only memory (ROM), a combination thereof, or the like. In an embodiment, the memory 720 may include ROM for use at boot-up, and DRAM for program and data storage for use while executing programs. The mass storage device 730 may comprise any type of storage device configured to store data, programs, and other information and to make the data, programs, and other information accessible via the bus. The mass storage device 730 may comprise, for example, one or more of a solid state drive, hard disk drive, a magnetic disk drive, an optical disk drive, or the like.

The video adapter 740 and the I/O interface 760 provide interfaces to couple external input and output devices to the processing unit. As illustrated, examples of input and output devices include a display 760 coupled to the video adapter 740 and any combination of mouse/keyboard/printer 770 coupled to the I/O interface 760. Other devices may be coupled to the processing unit 701, and additional or fewer interface cards may be utilized. For example, a serial interface card (not shown) may be used to provide a serial interface for a printer.

The processing unit 701 also includes one or more network interfaces 750, which may comprise wired links, such as an Ethernet cable or the like, and/or wireless links to access nodes or one or more networks 780. The network interface 750 allows the processing unit 701 to communicate with remote units via the networks 780. For example, the network interface 750 may provide wireless communication via one or more transmitters/transmit antennas and one or more receivers/receive antennas. In an embodiment, the processing unit 701 is coupled to a local-area network or a wide-area network for data processing and communications with remote devices, such as other processing units, the Internet, remote storage facilities, or the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for supporting two-level terminal-group based hybrid-automatic repeat request (HARQ) signaling, the method comprising:
   receiving, at a cooperating user equipment (CUE) within a virtual multi-point (ViMP) node comprising a plurality of UEs, a data packet for a target UE (TUE), within the ViMP node, that is broadcasted from a base station (BS) to the ViMP node;
   successfully decoding the data packet;
   in an absence of an acknowledgement (ACK) message or a negative ACK (NACK) message from the TUE, broadcasting, by the CUE, the data packet within the ViMP node; and
   subsequent to the broadcasting, and in an absence of the NACK message from the TUE, rebroadcasting, by the CUE, the data packet within the ViMP node until either the CUE receives a subsequent broadcast of the data packet from the BS, or the CUE receives the ACK message from the TUE or the ViMP node.

2. The method of claim 1 further comprising:
   receiving the broadcasted data packet from one or more UEs in the ViMP node.

3. The method of claim 2, wherein the data packet is rebroadcasted within the ViMP node until the CUE receives the subsequent broadcast of the data packet from the BS.

4. The method of claim 2, wherein the data packet is re-broadcasted until the ACK message is received from the TUE, a beacon UE, or any of the UEs in the ViMP node.

5. The method of claim 1 further comprising receiving the subsequent broadcast of the data packet from the BS in response to a timer pre-established by the BS expiring.

6. The method of claim 1, wherein the data packet is rebroadcasted within the ViMP node without using scheduling within the ViMP node and without synchronization with the BS.

7. The method of claim 1, wherein the data packet rebroadcasted to the UEs in the ViMP node comprises a network coded version of the same received and decoded data packet, additional coded symbols in case of a concatenated low-density parity check (LDPC) coding, or a given redundancy version in case of turbo coding.

8. The method of claim 7, wherein the network coded version comprises a linear combination of successfully decoded packets, and wherein the decoded packets are combined using coefficients that are sent to the TUE with information on which packets were network coded.

9. The method of claim 7, wherein the network coded version comprises a linear combination of successfully decoded packets, and wherein the decoded packets are combined using coefficients that are known beforehand by the TUE.

10. The method of claim 1 further comprising:
    receiving, from the BS, data packets with different HARQ redundancy versions, low-density parity check (LDPC) codewords, or both for different TUEs, wherein the different HARQ redundancy versions and LDPC codewords are mapped to orthogonal signatures; and
    rebroadcasting the data packets to the UEs in the ViMP node.

11. A method for supporting two-level terminal-group based hybrid-automatic repeat request (HARQ) signaling, the method comprising:
    receiving, at a cooperating user equipment (CUE) within a virtual multi-point (ViMP) node comprising a plurality of UEs, a data packet for a target UE (TUE), within the ViMP node, that is broadcasted from a base station (BS) to the ViMP node;
    successfully decoding the data packet;
    in an absence of an acknowledgement (ACK) message or a negative ACK (NACK) message from the TUE, broadcasting, by the CUE, the data packet within the ViMP node;
    subsequent to the broadcasting, receiving, by the CUE, the NACK message from the TUE;
    rebroadcasting, by the CUE, the data packet within the ViMP node in response to receiving the NACK message; and
    subsequent to the rebroadcasting, receiving either a subsequent broadcast of the data packet from the BS or the ACK message from the TUE.

12. The method of claim 11 further comprising:
    receiving the broadcasted data packet from one or more UEs in the ViMP node.

13. The method of claim 12, wherein the data packet is rebroadcasted within the ViMP node until the CUE receives the subsequent broadcast of the data packet from the BS.

14. The method of claim 12, wherein the data packet is rebroadcasted until the ACK message is received from the TUE.

15. The method of claim 11 further comprising receiving the subsequent broadcast of the data packet from the BS in response to a timer pre-established by the BS expiring.

16. The method of claim 11, wherein the data packet is rebroadcasted within the ViMP node without using scheduling within the ViMP node and without synchronization with the BS.

17. The method of claim 11, wherein the data packet rebroadcasted within the ViMP node comprises a network coded version of the same received and decoded data packet, additional coded symbols in case of a concatenated low-density parity check (LDPC) coding, or a given redundancy version in case of turbo coding.

18. The method of claim 17, wherein the network coded version comprises a linear combination of successfully decoded packets, and wherein the decoded packets are combined using coefficients that are sent to the TUE with information on which packets were network coded.

19. The method of claim 17, wherein the network coded version comprises a linear combination of successfully decoded packets, and wherein the decoded packets are combined using coefficients that are known beforehand by the TUE.

20. The method of claim 11 further comprising:
    receiving, from the BS, data packets with different HARQ redundancy versions, low-density parity check (LDPC) codewords, or both for different TUEs, wherein the different HARQ redundancy versions and LDPC codewords are mapped to orthogonal signatures; and
    rebroadcasting the data packets to the UEs in the ViMP node.

* * * * *